United States Patent
Fehrenbach et al.

(10) Patent No.: US 6,380,815 B1
(45) Date of Patent: Apr. 30, 2002

(54) MICROWAVE PULSE GENERATOR

(75) Inventors: Josef Fehrenbach, Haslach; Gregor Storz, Schramberg; Daniel Schultheiss, Hornberg, all of (DE)

(73) Assignee: Vega Grieshaber KG, Wolfach (DE)

( * ) Notice: Subject to any disclaimer, the term of this patent is extended or adjusted under 35 U.S.C. 154(b) by 0 days.

(21) Appl. No.: 09/704,863

(22) Filed: Nov. 2, 2000

Related U.S. Application Data

(63) Continuation of application No. 09/341,783, filed as application No. PCT/DE98/00081 on Jan. 12, 1998, now Pat. No. 6,175,283.

(51) Int. Cl.[7] .................................................. H03B 5/18
(52) U.S. Cl. ........................ 331/99; 331/117 D; 331/173
(58) Field of Search ........................ 331/96, 99, 117 D, 331/173

(56) References Cited

U.S. PATENT DOCUMENTS 4,906,946 A    3/1990   Mekata et al.
5,136,264 A  * 8/1992   Nardozza ..................... 332/102
5,198,783 A  * 3/1993   Jemison et al. ................ 331/66
5,446,419 A  * 8/1995   Miya et al. .................... 331/99
5,854,577 A  * 12/1998  Yoshida et al. ......... 331/117 D

* cited by examiner

Primary Examiner—Robert Pascal
Assistant Examiner—Henry Choe
(74) Attorney, Agent, or Firm—Foley, Hoag & Eliot LLP

(57) ABSTRACT

The invention relates to a microwave pulse generator for generating microwave pulses with a pulse duration in the nanosecond range. The microwave pulse generator includes a pulse generator for generating control pulses of a constant pulse duration and a microwave oscillator generating microwave oscillations. The microwave oscillator includes a transistor amplifier, to which a frequency-determining resonant circuit and an ohmic device for reducing the resonant Q-value are connected in such a way that a control pulse of the pulse generator applied to an input terminal of the transistor amplifier causes the microwave oscillator to produce a microwave oscillation that can be tapped at an output terminal of the microwave oscillator, wherein the microwave oscillation follows at least approximately the temporal course of the control pulse.

5 Claims, 3 Drawing Sheets

MICROWAVE PULSE GENERATOR

CROSS-REFERENCE TO OTHER PATENT APPLICATIONS

This application is a continuation of U.S. patent application Ser. No. 09/341,783, filed Jul. 16, 1999 now U.S. Pat. No. 6,175,283, which is a 371 of PCT/DE98/0081 filed Jan. 12, 1998.

FIELD OF THE INVENTION

The invention relates to a microwave pulse generator, in particular a microwave pulse generator for producing microwave pulses in the nanosecond range.

BACKGROUND OF THE INVENTION

Microwave pulse generators of this type are used in radar systems, in particular in pulsed radar systems, for exact distance measurements.

Such pulse generators should satisfy the following requirements:

a) The pulse duration of the microwave pulse has to lie in the range of one nanosecond, so that the pulsed radar can meet the requirement for high resolution.

b) The pulsed radar method requires a high coherence of the microwave pulse carrier frequency and the pulse repetition rate. To meet this requirement, an oscillator has to start oscillating always with the same initial phase.

c) The ratio of pulse period to pulse duration has to be large so that the following microwave pulse is transmitted only after all echoes from the target have been received.

d) The energy in the microwave pulse generator must decay quickly after a pulse, i.e., the transition from the pulse duration to the pulse pause has to occur quickly in order to capture very small echoes. The dynamic range of a pulse radar is typically between approximately 80 to 100 dB. The microwave pulse has to have decayed by this amount within a very short time. The RC resonator which determines the frequency, therefore has to have a small Q-value.

Conventional CW microwave oscillators are not adapted to generate coherent pulse trains, because they typically have resonant circuits with a high Q-value (Q>100) to maintain a sufficiently stable frequency. As a result, the settling time of such oscillators will be larger than 100 periods after being switched on, and then once again more than 100 periods until the oscillations have decayed after the oscillator is switched off. Consequently, special microwave pulse generators are very complex and produce a very broad spectrum from which the desired signal is filtered out with band pass filters. Disadvantageously, a microwave pulse generator of this type has a poor efficiency.

The German patent DE 44 01 350 C1 discloses a method for generating microwave pulses and a corresponding apparatus with a step recovery diode (SRD). The method and apparatus described therein satisfy the aforedescribed requirements (a) to (d), but have, as also discussed above, a very poor efficiency. The arrangement disclosed in the reference includes a pulse generator with a pulse differentiating circuit following the pulse generator. A subsequent matched network transmits the pulses to the step recovery diode which is integrated with a resonator. The resonator includes a capacitive and an inductive TEM line section together with the blocking capacitance of the step recovery diode. This arrangement already defines the center of the produced spectrum. Additional filtering with a band pass produces a microwave pulse with the carrier frequency $f_T$ and the pulse duration $t_p$.

It is an object of the present invention to provide a microwave pulse generator which requires few components and produces a microwave pulse with a pulse duration $t_p$ in the range of one nanosecond. It is another object of the invention to improve the efficiency of the microwave pulse generator by at least a factor of 10 over conventional pulse generators.

SUMMARY OF THE INVENTION

According to one aspect of the invention, the microwave oscillator includes an active semiconductor amplifier with a resonant circuit which determines the frequency, and an ohmic device, wherein the ohmic device is provided to specifically reduce the resonant Q-value of the resonant circuit in such a way that a control pulse applied to an input terminal of the semiconductor amplifier produces at the output terminal of the microwave oscillator a microwave oscillation which approximately follows the time dependence of the control pulse.

Specific embodiments of the invention are recited in the dependent claims.

According to an embodiment of the invention, the complexity of the circuit can be significantly reduced by generating control pulses of suitable duration which can be used to power a microwave oscillator or which can be applied to a control input of a semiconductor amplifier of the microwave oscillator. This arrangement obviates the need for expensive step recovery diodes.

The control pulse in the nanosecond range which determines the duration of the actual microwave pulse, may be produced, for example, with a simple pulse shortening stage.

According to another advantageous embodiment of the invention, a driver stage and/or a de-coupling stage can be used to improve coupling of the pulse shortening stage and the oscillator. If the pulse shortening stage is designed to provide an inverted output signal, then the inverted signal can be compensated by an inverting driver stage. Advantageously, the de-coupling stage can be implemented with a so-called "circular stub."

According to yet another advantageous embodiment of the invention, the oscillator may be formed as a series resonant circuit, which includes, for example, the gate-drain path of a gallium arsenide FET as a capacitive element. This significantly improves the efficiency of the arrangement.

According to another advantageous embodiment of the invention, the pulse shortening stage may include two bipolar transistors, with the input pulse supplied to the base terminal of the two transistors, wherein the collector-emitter path of the second transistor is connected in parallel with the base-emitter path of the first transistor, and wherein the input pulse is supplied to the second transistor via an RC circuit.

The invention will now be described with reference to the following drawings.

DESCRIPTION OF CERTAIN ILLUSTRATED EMBODIMENTS

Figure 1:
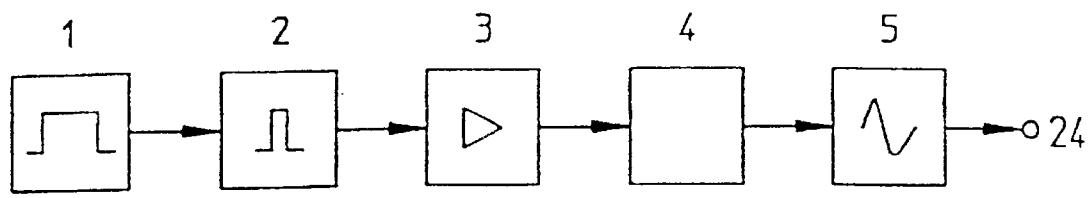
FIG. 1 is a block circuit diagram of an embodiment of the invention.

Referring now to FIG. 1, a pulse generator 1 supplies an output signal to the input of a pulse shortening stage 2. The pulse shortening stage 2 generates output pulses in the nanosecond range which are supplied to the input of a driver stage 3. The signal amplified by the driver stage 3 is supplied to a de-coupling network 4, with the output of the de-coupling network 4 connected to the supply voltage input of a microwave oscillator 5. The output signal of the microwave oscillator 5 is supplied to an output terminal 24.

Figure 2:
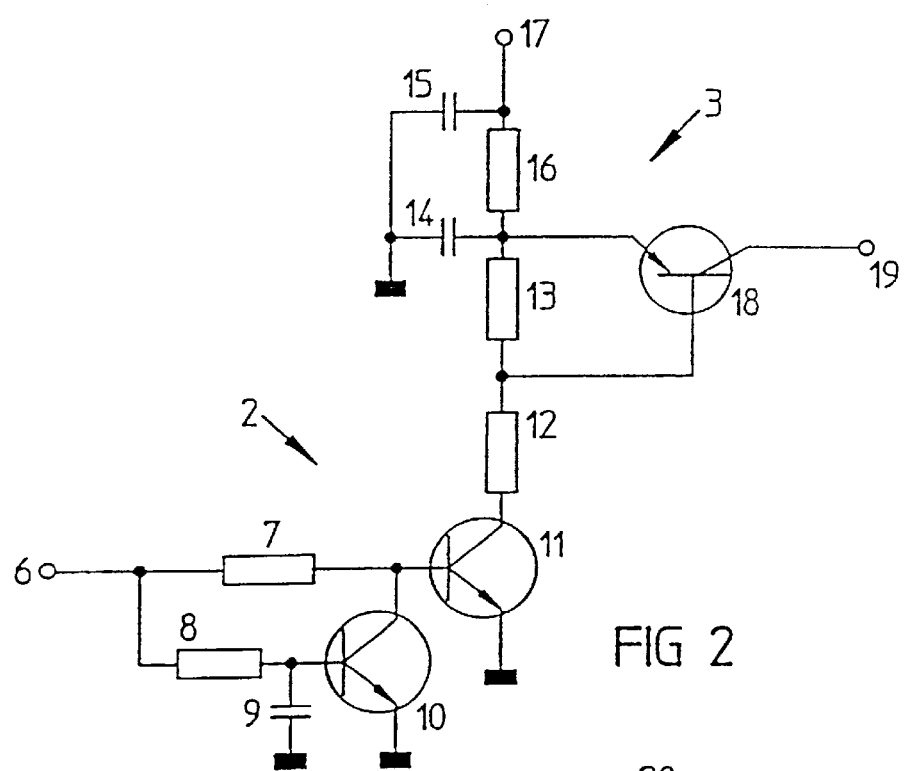
FIG. 2 is an embodiment of a pulse shortening stage with a subsequent driver stage.

The pulse generator 1 may be a conventional pulse generator supplying a pulse sequence with a predetermined pulse period. As seen in FIG. 2, the subsequent pulse shortening stage 2 may have an input terminal which is connected via a resistor 7 to the base of an npn transistor 11 and via a resistor 8 to the base of an npn transistor 10. A capacitance 9 is connected to ground between the resistor 8 and the base of the transistor 10. The collector of transistor 10 is connected to the base of transistor 11, whereas the middle of the transistor 10 is connected to ground. The emitter of transistor 11 is also connected to ground. The collector of transistor 11 forms the output circuit of the pulse shortening stage and is coupled to the input circuit of the subsequent driver stage 3. The collector is also connected to a supply voltage terminal 17 via a series connection of 3 resistors, 12, 13 and 16. The center tap of the series connection of resistor 12 and 13 is connected to the base of a pnp transistor 18, whereas the center tap of the series connection of resistor 13 and 16 is connected to the emitter of transistor 18. The collector of transistor 18 is connected to an output terminal 19. Both terminals of resistor 16 are connected to ground via the de-coupling capacitors 14 and 15.

Figure 3:
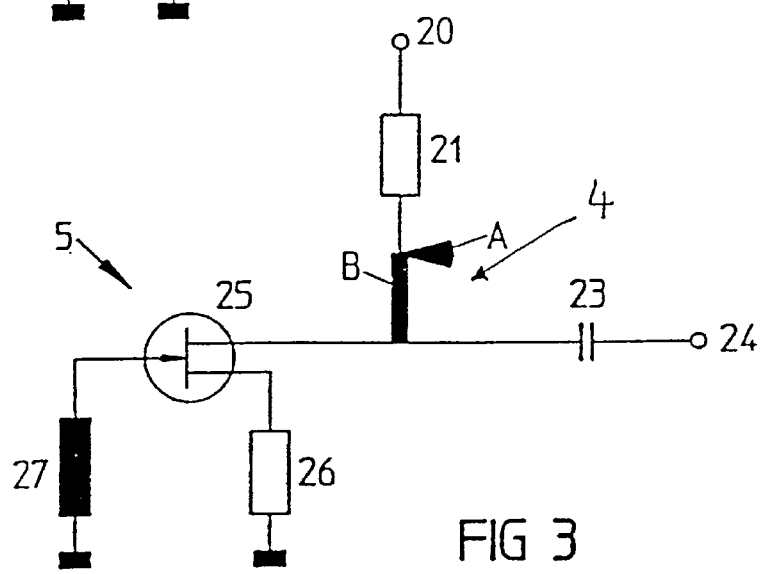
FIG. 3 is a first embodiment of a microwave oscillator.

The microwave oscillator according one embodiment of the invention may be designed as follows. Referring now to FIG. 3, a supply terminal is denoted with the reference numeral 20. The supply terminal 20 is connected via a resistor 21 to the circular stub A and to a $\lambda/4$ line B. The circular stub A and the $\lambda/4$ line B form a de-coupling network 4. The other end of the $\lambda/4$ line B is connected to ground through the load path of a transistor 25, which in the present example is a field effect transistor, and a resistor 26 connected in series with the transistor 25. The transistor 25 represents a semiconductor amplifier, but may also be a bipolar transistor. The drain terminal of the field effect transistor 25 is connected to the output terminal 24 via a capacitance 23. The gate terminal of the field effect transistor 25 is connected to ground through an inductance 27.

The output terminal 19 of the driver stage is connected to the supply terminal 20. A pulse sequence with a pre-determined pulse period is supplied to the input terminal 6. The pulse received from the pulse generator 1 is shortened in the pulse-shortening stage 2 to the length $t_p$. According to the embodiment of FIG. 2, the positive edge of the received pulse switches the transistor 11 to a conducting state when the pulse exceeds the base-to-emitter voltage. A current then flows through the voltage divider 12, 13, 16 whereby a large enough voltage drop is produced at the resistor 13 to switch the transistor 18 into a conducting state. At the same time, the positive edge of the received pulse is delayed via the RC circuit 8, 9 by a time defined by the RC circuit. The time delay can be adjusted between a fraction of a nanosecond to the length of the received pulse by selecting fast transistors. Following the delay time, the transistor 10 is switched to a conducting state, so that the voltage at the base of transistor 11 is reduced to the saturation voltage of transistor 10. The transistor 11 then returns to the highly resistive state and therefore also blocks transistor 18. As a result, a very short pulse which is able to support a low-resistance load, with a duration $t_p$ is produced at the output terminal 19. The finite rise times of the transistor 10, 11 and 18 cause the output pulse to have a time dependence which can be best described by a $\sin^2$-function. The network 13, 15, 16 serves to block the supply voltage supplied at the supply terminal 17. The pulse shortening stage 2 and the driver stage 3 complement each other in the present example, since both stages invert the signal to be processed, so that a non-inverted signal is provided at the output 19.

This so obtained signal with a pulse duration which corresponds to the duration of the microwave pulse, is supplied to the microwave oscillator as a supply voltage via the terminals 19 and 20. The microwave oscillator 5 includes a transistor 25, which in the present example is a gallium arsenide field effect transistor. However, a suitable bipolar transistor may also be used. In addition, the inductance 27 may be implemented in the form of an inductive TEM line section. The resonant circuit of the microwave oscillator 5 which determines the frequency, is formed of this line section and the internal transistor capacitance between the gate and drain in the case of FET transistors and between the base and collector in the case of bipolar transistors, respectively. The wave guide section 27 together with the transistor capacitance forms a series resonant circuit which can be tuned by changing the length of the wave guide section. This arrangement also satisfies the pre-oscillation phase condition. The resistor 26 is required to reduce the Q-value of the resonance to assure a rapid start-up transient of the oscillation. A resistor 21 is connected in series between the driver stage 3 and the de-coupling network 4 to limit the current through the transistor 25. The capacitor 23 blocks the supply voltage and thereby de-couples the output signal of the microwave oscillator 5.

The microwave oscillator 5 is designed to produce a CW signal at the resonance frequency of the controlling resonant circuit when a supply voltage is applied to the terminal 20. When the length of the line forming the inductance 27 is adjusted, the transformed portion of the self-inductance of the resistor 26 parallel to the inductance 27 has to be taken into account.

As described above, power to the microwave oscillator 5 is supplied by a pulse of duration $t_p$. To de-couple the pulse shortening stage and the following driver stage 3, the pulse is supplied to the supply terminal 20 of the microwave oscillator via the de-coupling network 4 consisting of the circular stub A and the $\lambda/4$ line B. The length of the pulse thus determines the length of the microwave pulse. The circular stub A represents a short-circuit at the carrier frequency $f_T$, which is converted to an open circuit by the $\lambda/4$ line B. Consequently, high frequency from the microwave oscillator 5 cannot reach the driver stage 3.

To attain a rapid build-up and decay of the oscillation, the source terminal should be connected to ground through the resistor 26. The resistor 26 reduces the Q-value of the resonant circuit so that the amplitude of the microwave oscillation follows the amplitude of the supply pulse, as shown in FIG. 4.

The microwave oscillation becomes coherent since the pulse for supplying the microwave oscillator 5, which has a length of approximately 1 nanosecond, has a short rise time of approximately 250 ps, and therefore couples a spectral energy contribution into the microwave oscillator 5 at the resonance frequency. The initial phase of the microwave signal is thereby absolutely defined.

The microwave pulse is coupled out at the output terminal 24 of the microwave oscillator 5 via the capacitor 23. At this point, the shortened pulse is still superimposed on the microwave pulse, but can be filtered out by a high-pass filter. If the resulting microwave pulse, however, is transmitted through a wave guide, then the additional high-pass filter can be eliminated since the wave guide has the same characteristics as a high-pass filter.

Figure 4:
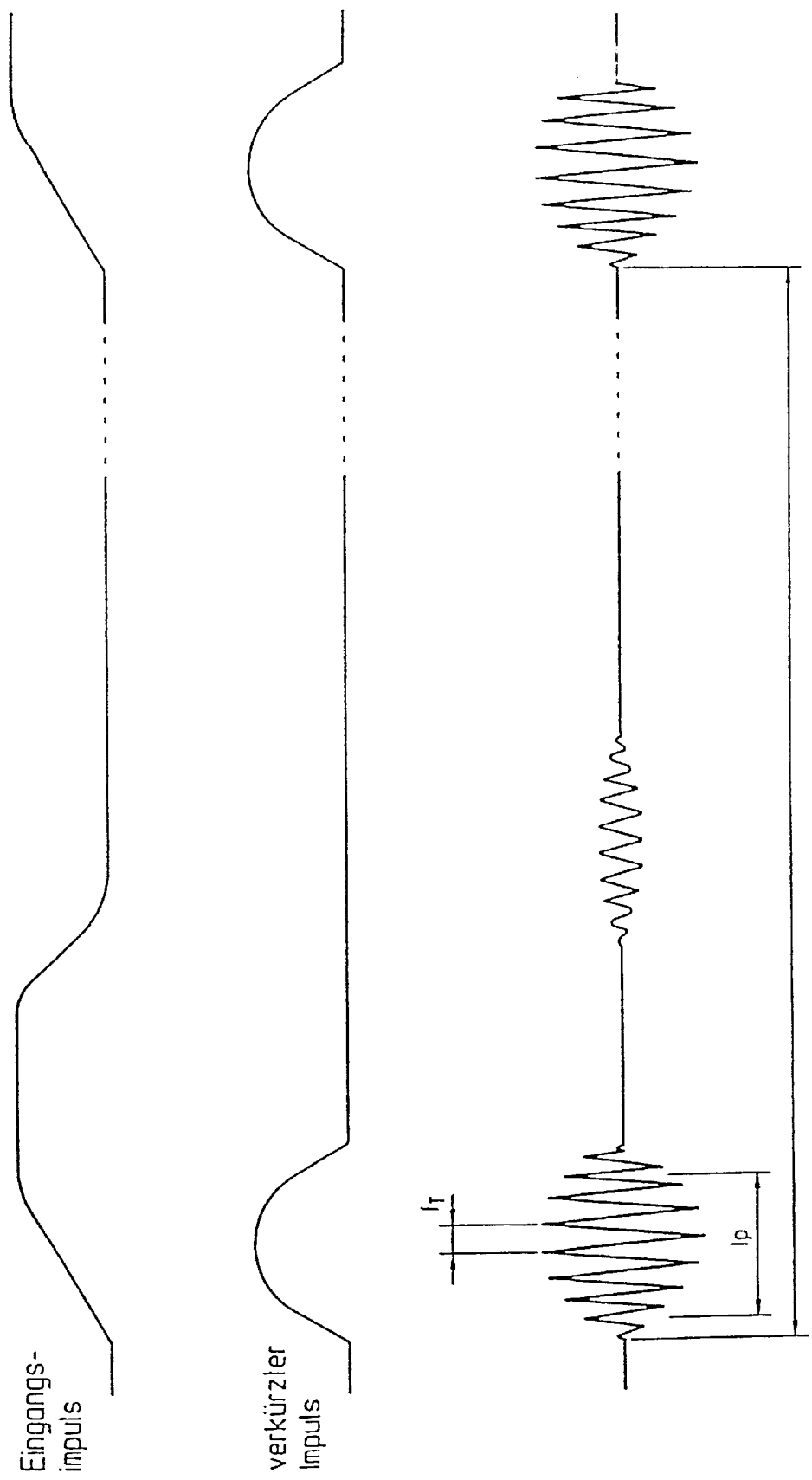
FIG. 4 is a timing diagram of a sequence of output signals.

FIG. 4 shows the time-dependence of two successive microwave pulses, $I_1$ and $I_2$. Also shown between the two pulses, $I_1$ and $I_2$, is an echo E which can be used, for example, for distance measurements. The oscillator period is designated with $f_r$ and the pulse duration with $t_p$.

Figure 5:
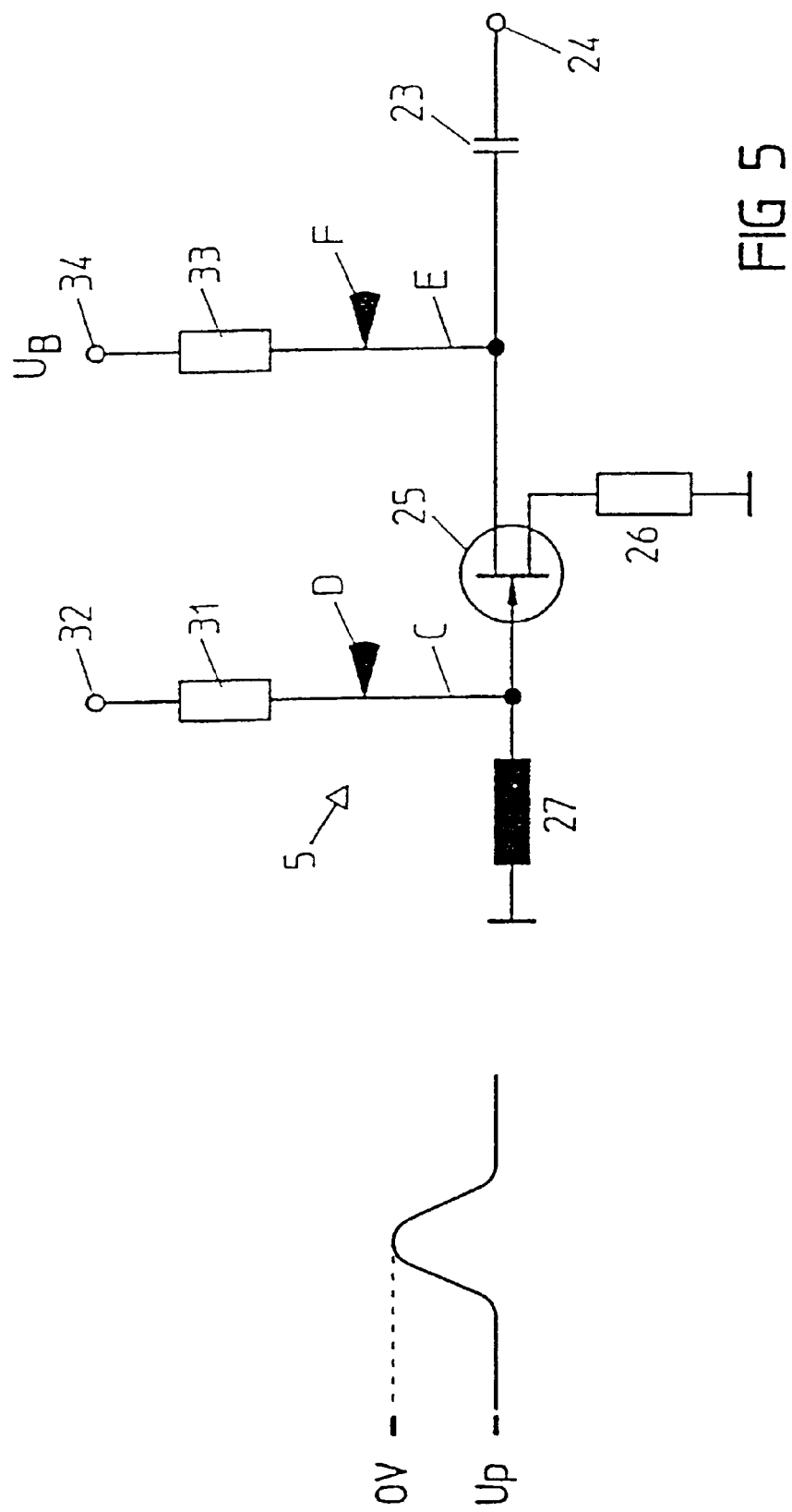
FIG. 5 is a second embodiment of a microwave oscillator.

A second embodiment of a microwave oscillator 5 is shown in FIG. 5. In this embodiment, the pulse from the pulse shortening stage 2 is supplied to the microwave oscillator 5 via a control electrode of the semiconductor amplifier 5, which is different from the voltage pulse supplied to the microwave oscillator in the embodiment illustrated in FIG. 3. The microwave oscillator 5 again has a transistor 25 which is implemented as a gallium arsenide field effect transistor (GaAs-FET). Connected to the gate of the GaAs-FET 25 is again an inductive TEM line forming an inductance 27 (e.g., an open microstrip line having a length of $\lambda/4$ and $\lambda/2$). Also connected to the gate of the GaAs-FET 25 is the output of a de-coupling network consisting of a $\lambda/4$ line C and a circular stub D. The input of the de-coupling network is connected through a resistor 31 to an input terminal 32 of the microwave oscillator 5. The drain terminal of the GaAs-FET 25 is as before connected to the supply terminal 34 via a de-coupling network consisting of a $\lambda/4$ line E and a circular stub F, and a resistor 33. A constant supply voltage $U_B$ can be applied to the supply terminal 34. In addition, the microwave signal is coupled out at the drain terminal of the gallium arsenide FET to the output terminal 24 through a coupling capacitor 23. The source terminal of the gallium arsenide FET 25 is connected to ground via a resistor 26.

The exemplary microwave oscillator 5 operates as follows, assuming that the control pulse has the time dependence shown on the left side of FIG. 5, i.e., a time dependence following a $\sin^2$-function which rises from the potential $U_p$ to a maximum at zero volt and then drops again to the potential $U_p$. As long as a negative voltage is applied to the control input of the microwave oscillator 5, i.e. to the input terminal 32, which has a larger value than the pinch-off voltage $U_p$, the GaAs-FET 25 is blocked. When the pulse causes the voltage at the input terminal 32 to rise to 0 volts, then the microwave oscillator 5 oscillates at the resonant frequency of the series resonant circuit consisting of the inductive TEM line section 27 and the internal transistor capacitance between drain and gate. The frequency can be adjusted by changing the length of the line at the gate. This also affects the required phase shift for the oscillation. The resistor 26 limits the Q-value of the resonant circuit, thereby allowing a rapid build-up and decay of the oscillation of the microwave oscillator.

During pulsed operation, the level at the control input, i.e., at the input terminal 32, changes between zero volt and a negative voltage. Due to the small Q-value of the resonant circuit, the form of the envelope of the microwave oscillation is identical to the form of the control pulse. The microwave oscillations become coherent because the steep edge of the control pulse impresses a spectral energy content on the microwave oscillator 5. Consequently, the initial phase is always the same. By controlling the microwave oscillator 5 with a short control pulse with a steep edge, an essentially equally short microwave pulse with a fixed phase is produced at the output terminal 24 of the microwave oscillator 5. Advantageously, the microwave pulse is produced with a significantly greater efficiency than pulses obtained with conventional microwave pulse generators.

What is claimed is:

1. A microwave pulse generator for generating microwave pulses having a pulse duration in the nanosecond range, comprising:

a pulse generator for generating control pulses, and a microwave oscillator for generating microwave oscillations, the microwave oscillator including an active semiconductor amplifier which includes
a resonant circuit determining a frequency, and
an ohmic device which reduces the resonant Q-value of the resonant circuit, with a first terminal of the ohmic device connected to a reference potential and a second terminal of the ohmic device connected to a source terminal of the semiconductor amplifier, wherein a control pulse of the pulse generator supplied to an input terminal of the semiconductor amplifier produces a microwave oscillation that can be tapped at an output terminal of the microwave oscillator, wherein the microwave oscillation at least approximately follows the temporal course of the control pulse, and wherein the microwave pulses are coupled out at a source/emitter terminal of a transistor, wherein the semiconductor amplifier is formed by said transistor and the resonant circuit determining the frequency is formed by an internal capacitance of said transistor and an inductance connected to the gate terminal of said transistor, and wherein the microwave oscillator comprises a series resonant circuit with an inductance and the gate/base-drain/collector path of said transistor.

2. Microwave pulse generator according to claim 1, wherein the ohmic device is a resistor.

3. Microwave pulse generator according to claim 1, wherein the inductance is formed as an inductive TEM line section.

4. Microwave pulse generator according to claim 1, wherein the input terminal for the control pulse is coupled to one of the control input of the semiconductor amplifier and an output of the semiconductor amplifier.

5. Microwave pulse generator according to claim 1, wherein the transistor is a gallium arsenide field effect transistor or a bipolar transistor.

* * * * *